United States Patent [19]

Lazzari

[11] 4,311,727
[45] Jan. 19, 1982

[54] METHOD FOR MULTILAYER CIRCUITS AND METHODS FOR MAKING THE STRUCTURE

[75] Inventor: Jean-Pierre Lazzari, Montfort l'Amaury, France

[73] Assignee: Compagnie Internationale pour l'Informatique CII Honeywell Bull (Societe Anonyme), Paris, France

[21] Appl. No.: 12,450

[22] Filed: Feb. 15, 1979

Related U.S. Application Data

[62] Division of Ser. No. 792,210, Apr. 29, 1977, Pat. No. 4,189,524.

[30] Foreign Application Priority Data

May 6, 1976 [FR] France .................. 76 13553

[51] Int. Cl.³ .................. B05D 5/12; H01L 21/283
[52] U.S. Cl. .................. 427/58; 156/600; 427/79; 427/85; 427/89; 427/90; 427/96; 427/123; 427/127; 427/383.9
[58] Field of Search .................. 427/85, 89, 90, 96, 427/123, 79, 58, 127, 383.9; 357/71; 156/600; 361/411; 174/68.5; 428/901

[56] References Cited

U.S. PATENT DOCUMENTS

| | | | |
|---|---|---|---|
| Re. 29,326 | 7/1977 | Lazzari et al. | 360/120 |
| 3,461,357 | 8/1969 | Mutter et al. | 357/71 |
| 3,723,665 | 3/1973 | Lazzari et al. | 360/120 |
| 3,751,292 | 8/1973 | Kongable | 427/89 |
| 3,808,049 | 4/1974 | Caley et al. | 361/411 |
| 3,844,831 | 10/1974 | Cass et al. | 427/89 |
| 3,846,841 | 11/1974 | Lazzari et al. | 360/122 |
| 3,983,284 | 9/1976 | Croset | 427/90 |
| 4,045,594 | 8/1977 | Maddocks | 427/90 |
| 4,090,006 | 5/1978 | Havas et al. | 427/89 |
| 4,107,726 | 8/1978 | Schilling | 357/71 |

OTHER PUBLICATIONS

Noubel et al. "Metallurgy Including a Chromium Slice" IBM TDB, vol. 11, No. 7, Dec. 1968, p. 769.

*Primary Examiner*—John D. Smith
*Attorney, Agent, or Firm*—Kerkam, Stowell, Kondracki & Clarke

[57] ABSTRACT

To reduce the proportion of rejects resulting by reasons of short circuits in the manufacture and use of miniaturized multilayer circuits and to improve the electric efficiency, there is inserted between each conductive layer of low resistance and each insulating layer of high thermal stability, a very thin layer of a conductive material, preferably non-magnetic, of high resistivity and of crystallographic reference at least compatible with respect to the first conducting material and of low or negligible thermal expansion in the range of temperatures to which the circuits are submitted both during manufacture and use.

8 Claims, 3 Drawing Figures

METHOD FOR MULTILAYER CIRCUITS AND METHODS FOR MAKING THE STRUCTURE

This is a division of application Ser. No. 792,210, filed Apr. 29, 1977, now U.S. Pat. No. 4,189,524, which is also the parent of copending application Ser. No. 055,497 filed July 6, 1979 and assigned to the same assignee as the instant application.

BACKGROUND OF THE INVENTION

The present invention has for its object an improved structure of multilayer circuits essentially useful in the technology of electric components of the type called "miniaturized".

These multilayer circuits are normally constituted of a stack of "thin" layers, alternatively conductive and insulating, which are deposited in superposition, one atop the other, by any suitable means, such as well known chemical, aqueous, or vacuum deposition processes and all others, all such procedures coming within the realm of the invention which seeks to correct defects which occur regardless of the technology utilized for the deposition of the layers.

These thin layers may, as required, be conformed during and with respect to the production of the stack to obtain desired volumetric electric circuit configurations. The term "thin layer" is intended here in its presently accepted meaning:—layers of which the thicknesses are located from a few several hundreds of angstroms up to a small number of microns, less than 10.

A particular problem of multilayer circuits is that of short circuits which occur either during manufacture or in use. It is important since this effects not only the economics of manufacture but also the reliability of the products.

In a general way, it is desirable that the conductive layers be, in multi-layer circuits, relatively as thick as possible and the interposed insulating layers, relatively as thin as possible so that their electric efficiency is high. The short circuits appear more frequently as the insulating layers are made thinner. But it can also be stated that the frequency of short circuits increases with the thickness of the conductive layers which may require further explanation.

Whatever the technique used for deposition, the state of the surface of a conductive layer degrades as the thickness increases. The growth of crystalline nature and the mesh or size of the crystals increases rapidly with this thickness primarily under the effect of the macles or twins which are produced and the accumulation of defects in the microscopic range causing most often small crystalline growths. However, a very thin layer reproduces accurately the state of the surface of the substrate on which it is deposited. It follows that when a very thin insulating layer is formed on a relatively thick conductive layer whose surface condition is poor for the reasons above discussed, the very thin insulating layer will reproduce all of the defects of the surface of the conductive layer and will present variations of thickness leading readily to the existence of microporosities and the appearance of short circuits.

These risks of production of short circuits during manufacture therefore introduce a by no means negligible limitation on the ratios of the thicknesses of the conductive and insulating layers in multilayer circuits.

Further, multilayer circuits must often support during use of equipment in which they are incorporated large elevations of temperature which can for example reach 450° C. or thereabout. However, the conductive materials currently utilized in these circuits because they have a low resistivity, favorable to the flow of electric current, are, usually, the four metals of the group of copper, aluminum, silver and gold and their alloys. Each of these standard metals has a coefficient of its thermal expansion which is relatively large, that for copper, for example, being $14 \cdot 10^{-6}/°C.$, and crystallize easily when the temperature increases, with grains which enlarge quickly. The lattice of the crystalline structure is therefore under considerable stresses entailing or producing the formation of fissures. Thus, a metal-insulator-metal structure can develop a short circuit when submitted to an elevation of temperature which modifies the regular crystalline structure of the metal.

The object of the invention is to eliminate the above-described difficulties and particularly, to provide multilayer circuits with any desirable "high ratio" between the thicknesses of the conducting and insulating layers. The problem of the elevations of temperatures with respect to the insulating layers can be ignored since the materials usual for these insulating layers have high thermal stability at the temperatures to be considered for the efficiency of the circuits.

SUMMARY OF THE INVENTION

To these ends, the invention provides for multilayer circuits of the type above discussed a new structure essentially characterized in that it comprises between each thick layer of conductive material of low resistivity and relatively high coefficient of thermal expansion and at least the insulating layer which should separate it from the thick conductive layer following the stacking, a thin conductive layer of a conductive material having a relatively high resistivity with respect to the conductive material of low resistivity forming the conductors of the multilayer circuit, having a low thermal coefficient of expansion at least at the operating temperatures of the circuit and a crystalline lattice and size at least close to or similar to those of the conductive material of low resistivity.

The additional thin conductive layer having these properties could be deposited only on one side of the thick conductive layer, namely that side on which there will afterwards be formed a thin insulating layer in the course of deposition of the succeeding layers in the stack. It may be better for the final result to sandwich all thick conductive layers between two such additional thin layers in considering especially the point of view of heating during the use of the circuits.

The provision of these thin additional conductive layers assures that each very thin insulating layer of the stack will be deposited on a substrate of very good surface state and therefore at this level to prevent any appreciable microporosity in spite of its thickness ratio with respect to the conductive layer of low resistivity above which it is located higher than desirable for the object sought, that is the intensity of the electric current that the circuits should support during its use.

The choice of the material of the additional conductive layers assures at least and in fact reinforces the mechanical homogeneity of the multilayer because of the close crystallographic relationship between the conductive materials of the thick and thin layers. When further, the deposition process utilized requires heat, primarily in the case of evaporation under vacuum or under controlled atmosphere, the formation of an additional conductive layer thermally more stable on the crystalline plane assures to a certain degree a reduction of the macles or twins which may have occurred during the deposit of the underlying conductive layer of low resistivity. Actually, the additional material will be doped by the material of the underlying conductive layer to a certain predeterminable depth and during the dopage the superficial macles of the deposited layer will be destroyed, because their materials combine in doping with the crystals of the additional material over the said depth. Further, the interposition of the additional material has an additional advantage. Generally speaking, the conductive material of low resistivity will much more likely oxidize than the material of high resistivity forming the interposed layer. During the formation of the insulating layer, which in fact has an oxide base, in the process of deposition by evaporation under a controlled atmosphere, the oxygen utilized could and in fact does oxidize the surface of conductive layer of low resistivity. The additional layer will avoid this inconvenience.

The utilization of the sandwich form as discussed still further reduces the occurrences of the enumerated inconveniences as to the normal conductive layers of the multilayers.

When utilizing a multilayer circuit provided in accordance with the present invention subject to large heating up to, for example 450° C., the value which is taken as a limit in practice, this heating instead of being destructive of the electric insulation acts as a simple annealing reinforcing the doping and stabilizing the multilayers with respect to short circuits and with respect to further heatings. The useful thickness of the layers of low resistivity for the normal intensities of the electric currents in use with the multilayers will be evaluated as a function of a known value in the art, knowing the facility of doping of the additional material by the less stable material from the thermal point of view, thus diffusing in the additional material.

It can therefore be provided, for example, that before any delivery for use, a multilayer of the present invention will be subjected to a systematic annealing at this maximum temperature and thereafter tested. When no short circuit is then revealed, the multilayers will have a very strong probability of reliability in use.

DESCRIPTION OF THE PREFERRED EMBODIMENTS

Figure 1:
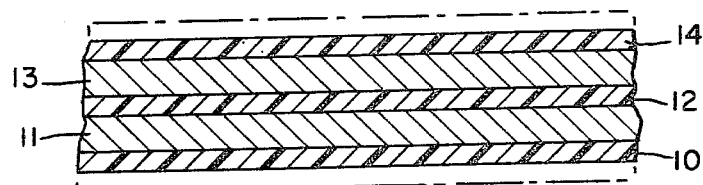
FIG. 1 is a fragmentary view, in vertical cross section, of a multi-layer structure of the type known in the prior art.

As shown in FIG. 1, a multilayer circuit of the type known in the prior art is made of alternatively depositioned layers one atop the other. After a thin film insulating layer 10 has been deposited over priorly formed layers (not shown), a conducting material layer 11, made of a material of relatively low resistivity and relatively high thermal expansion is deposited. Over this layer 11, which is thicker than the insulating film 10, there is deposited another thin film 12 of insulating material, and, thereafter, another conducting layer 13 of identical characteristics to layer 11. Over this further conducting layer 13, a further insulating film 14 is deposited; and so forth, the remaining layers of the stack not being shown. It must be understood that each insulating film is made of a refractory material such as, mainly, silica or ceramic.

The disadvantages of this conventional stack and defects resulting thereof have been hereinbefore described.

Figure 2:
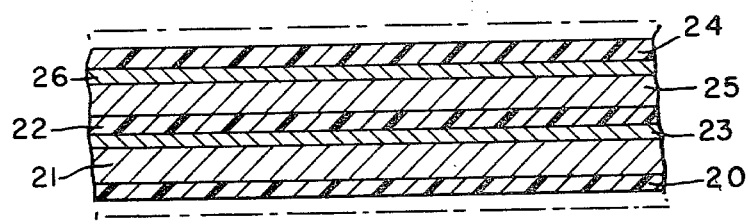
FIGS. 2 and 3 are fragmentary views, in vertical cross section, of multi-layer structures made in accordance with the present invention.
Figure 3:
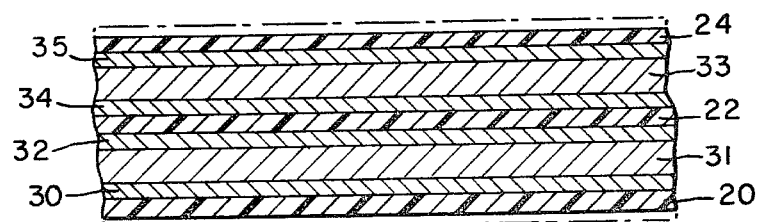

A multilayer stack made according to the teachings of the invention is shown in FIGS. 2 and 3.

In FIG. 2, between each of two insulating films 20, 22 and 22, 24, are inserted composite conducting layers, each comprises of a thicker low resistivity relatively high thermal expansion coefficient material, 21 and 25, respectively, and of a thinner layer, or film, 23 and 26, respectively, of a conducting material of relatively higher resistivity and relatively low thermal expansion coefficient. However, the materials of these two layers are so selected as to have close crystallographic characters, as it has been herein described.

In FIG. 3, between each of the two insulating films 20, 22 and 22, 24, are inserted composite conducting layers, each comprised of a pair of conducting films 30, 32, respectively, and 34–35, respectively, of a relatively high resistivity and high thermal strength. Between each pair of conducting films is a thicker conducting layer 31, 33 respectively, of a material of relatively low resistivity and relatively low thermal strength, however, the materials of the said layer and films are selected to present close crystallographic characters, as herein described.

In further explanation of the invention, an example can be considered in which the conductive material having low resistivity forming the thick conductive layers is copper, the material of the additional layers is chromium and the insulating material is silica. Silica is the most common binary compound of silicon and oxygen ($Si O_2$) and an insulating refractory material. Chromium and copper have somewhat similar crystallographic characteristics. Copper crystallizes in cubic form with centered faces and chrome crystallizes in cubic form with centered bodies, the dimensions of the lattice being close in these two materials. Chromium, as known, does not expand appreciably at a temperature not above approximately 450° C. It oxidizes only little beneath this limit of temperature when heated in an oxidizing atmosphere.

Two hundred (200) specimens of multilayer circuits were formed in two series. In the first only the usual structure was utilized, alternating regularly thick layers of copper on the order of one to four microns and thin insulating layers of silica on the order of 800A. In the second series, the present invention was utilized by separating each thick conductive layer from each thin insulating layer by a thin layer of chromium on the order of 200A in thickness.

With the multilayers of the first series, the range of loss after manufacture was on the order of 8% increasing to 96% at least when then followed by an annealing of the type described above. With the multilayers of the second series the range of losses was initially on the order of 2% and was raised to only about 15% after annealing.

The above example where the materials are copper and chromium is obviously only illustrative. There is a rather large choice from the crystallographic point of view and from the electric and thermal point of view involving a certain range of limitations of choice based on the one hand on the deposition process utilized and on the other hand whether or not magnetic materials can be employed in the stack.

From this last point of view all magnetic materials which would otherwise be useful—beta cobalt, nickel, for example, will be eliminated except to assure during manufacture a dopage such that the final form would be non-magnetic when required, by introduction of an additional doping element assuring such a transformation.

To manufacture multilayer circuits by application of evaporation in a controlled atmosphere, there will be eliminated bodies which evaporate badly; primarily the metalloids such as strontium, calcium, thallium, rhodium whose other characteristics of which would be compatible with the manufacture of the invention by other deposit procedures.

After the application of the elimination criteria set forth above, only simple crystalline bodies which crystallize similar to copper remain, such as, for example, chrome, titanium deposited in beta form and vanadium, and their alloys, or from that formed by Nickel and Beta Cobalt doped with the first material for a fabrication which relies on evaporation in a controlled atmosphere and where copper is the normal conductive material in the multilayers.

On the other hand, the use of aluminum for the material of low resistivity becomes easy since, when covered with thin additional layers of the invention, it does not oxidize during the deposit of silica, whereas previously oxidizing made its use difficult.

It should be noted that the use of bodies or alloys of similar crystallography, but not identical to that of the materials of low resistivity is made possible because, by evaporation under vacuum, at least, the well known phenomena of epitaxy comes into action in the deposit of thin layers, a phenomena which tends to cause the newly evaporated substance to "copy" the lattice of the substance which constitutes the substrate for it.

The thicknesses of the additional layers need not in practice of the invention be greater than 5000A, any more than the thicknesses of the insulating layers had, or still have, any need to be as much as a micron, since the thickness of the layers are not critical, it is obviously desirable to avoid the dissipation of the materials in industrial manufacture.

I claim:

1. The method of producing a multilayer thin film device adapted to withstand temperature elevations of up to 450° C. without appreciable risk of short-circuits between successive conductor layers thereof comprising the steps of repeatedly depositing in alternate deposition steps, one atop the other, thin film layers of a refractory insulating material and thicker film layers of a conductive material having relatively low resistivity and a relatively low appreciable thermal expansion as the temperature rises, further comprising the step of depositingly interposing between any such thicker conductive layer and at least an adjacent such thin film insulating layer a thin layer of a conductive material of higher resistivity than the said thicker layer conductive material, and virtually negligible thermal expansion at temperature elevations up to 450° C., and having crystallographic references intrinsically and/or epitaxially similar to the corresponding lattice and mesh size references of the material of the said thicker layers.

2. The method of producing a multilayer thin film device comprising the steps of:
repeatedly depositing in alternate deposition steps, one atop the other, thin film layers of insulating material and conductive layers having an interface area in between, each conductive layer having at least a thicker film layer of relatively low resistivity conductive material, and depositing at least one thin layer of conductive material interposed between one such thicker film layer and an adjacent thin film insulating layer, said thin layer conductive material having higher resistivity than the thicker film conductive layer and the interface areas are substantially equal on either side of at least one of said conductive layers.

3. The method of producing a multilayer thin film device comprising the steps of:
repeatedly depositing in alternate deposition steps, one atop the other, thin film layers of insulating material and conductive layers such that each conductive layer is sandwiched between two thin film insulating layers, each conductive layer having at least a thicker film layer of relatively low resistivity conductive material and depositing at least one thin layer of conductive material interposed between a thicker film conductive layer and an adjacent thin film insulating layer, said thin layer conductive material having a higher resistivity than the thicker film conductive material.

4. The method according to claim 1, 2 or 3, comprising the step of interposing between any such thin film insulating layer and any such thicker conductive layer a thin layer of said conductive material of higher resistivity.

5. The method according to claim 1, 2 or 3, wherein the deposition step of each layer thereof includes application of heat to at least the layer which has just been deposited in the previous step of production of the multilayer device, whereby any thicker conductive layer material is at least partially doped by the material of any adjacent thin conductive layer during the deposition thereof.

7. The method according to claim 1, 3 or 6 further including the step of completely doping the material of the said thicker conducting layers by the material of the said thin film layers.

8. The method according to claim 7, 3 or 6 wherein said doping step is carried out by the application of heat.

6. The method to claim 1, 2, or 3 wherein each conductive layer is deposited upon an insulating layer having substantially the same thickness throughout.

* * * * *

UNITED STATES PATENT AND TRADEMARK OFFICE
CERTIFICATE OF CORRECTION

PATENT NO. : 4,311,727
DATED : January 19, 1982
INVENTOR(S) : Jean-Pierre LAZZARI It is certified that error appears in the above-identified patent and that said Letters Patent are hereby corrected as shown below:

Claim 7, column 6, line 50, change "3 or 6" to --2 or 3--;

Claim 8, column 6, line 54, change "3 or 6" to --2 or 3--.

Signed and Sealed this

Fifteenth Day of June 1982

[SEAL]

*Attest:*

*Attesting Officer*

GERALD J. MOSSINGHOFF

*Commissioner of Patents and Trademarks*